(12) United States Patent
Neyret et al.

(10) Patent No.: US 7,514,341 B2
(45) Date of Patent: Apr. 7, 2009

(54) FINISHING PROCESS FOR THE MANUFACTURE OF A SEMICONDUCTOR STRUCTURE

(75) Inventors: Eric Neyret, Sassenage (FR); Alice Boussagol, Brignoud (FR); Nadia Ben Mohamed, Renage (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 330 days.

(21) Appl. No.: 11/356,926

(22) Filed: Feb. 16, 2006

(65) Prior Publication Data

US 2007/0148910 A1 Jun. 28, 2007

(30) Foreign Application Priority Data

Dec. 22, 2005 (FR) .................... 05 13127

(51) Int. Cl.
*H01L 21/30* (2006.01)
(52) U.S. Cl. .................. 438/459; 438/458; 438/663; 438/455; 257/E21.214
(58) Field of Classification Search .............. 438/455, 438/458, 459, 663
See application file for complete search history.

(56) References Cited

U.S. PATENT DOCUMENTS

| 5,374,564 | A | 12/1994 | Bruel | 438/455 |
|---|---|---|---|---|
| 6,100,166 | A | 8/2000 | Sakaguchi et al. | 438/455 |
| 6,403,450 | B1 | 6/2002 | Maleville et al. | 438/471 |
| 7,288,418 | B2 * | 10/2007 | Barge et al. | 438/4 |
| 2002/0061660 | A1 | 5/2002 | Ito | 438/795 |
| 2002/0106870 | A1 | 8/2002 | Henley et al. | 438/464 |
| 2004/0115905 | A1 | 6/2004 | Barge et al. | 438/473 |

(Continued)

FOREIGN PATENT DOCUMENTS

EP   1 193 749 A2   4/2002

(Continued)

OTHER PUBLICATIONS

Aspar et al., "Smart-Cut Process: An Original Way to Obtain Thin Films by Ion Implantation," Conference on Ion Implantation Technology, Sep. 17-22, 2000, pp. 255-260.

(Continued)

*Primary Examiner*—Marcos D. Pizarro
*Assistant Examiner*—Eva Y. Montalvo
(74) *Attorney, Agent, or Firm*—Winston & Strawn LLP

(57) ABSTRACT

The invention relates to a process for the formation of a structure comprising a thin layer made of semiconductor material on a substrate, including the steps of providing a zone of weakness in a donor substrate; bonding the donor substrate to a support substrate; detaching a portion of the donor substrate to transfer it to the support substrate, wherein the detaching includes applying heat treating the donor substrate to weaken the zone of weakness without initiating detachment and applying an energy pulse to provoke self-maintained detachment of the donor substrate portion to transfer it to the support substrate; and subjecting the transferred portion of the donor substrate to a finishing operation to form a thin layer. The finishing operation is simplified compared to that which is conducted by a conventional process that achieves detaching by applying a heat treatment to provoke self-maintained detachment of the donor substrate portion, and the thin layer has a surface of the same smoothness as one prepared by the conventional process.

16 Claims, 3 Drawing Sheets

U.S. PATENT DOCUMENTS

| | | | |
|---|---|---|---|
| 2004/0142542 A1* | 7/2004 | Murphy et al. | 438/479 |
| 2004/0151483 A1 | 8/2004 | Neyret et al. | 392/416 |
| 2004/0161948 A1 | 8/2004 | Maleville et al. | 438/795 |
| 2004/0166650 A1 | 8/2004 | Yokokawa et al. | 438/455 |
| 2004/0192067 A1* | 9/2004 | Ghyselen et al. | 438/763 |
| 2004/0248380 A1* | 12/2004 | Aulnette et al. | 438/459 |
| 2004/0259328 A1* | 12/2004 | Ito et al. | 438/459 |
| 2005/0014346 A1 | 1/2005 | Mitani et al. | 438/458 |
| 2005/0026426 A1* | 2/2005 | Maleville et al. | 438/663 |
| 2005/0148163 A1* | 7/2005 | Nguyen et al. | 438/514 |
| 2006/0060943 A1* | 3/2006 | Ben Mohamed et al. | 257/607 |
| 2006/0099779 A1* | 5/2006 | Cayrefourcq et al. | 438/486 |
| 2008/0014718 A1* | 1/2008 | Neyret et al. | 438/459 |

FOREIGN PATENT DOCUMENTS

| | | |
|---|---|---|
| FR | 2 797 713 A1 | 2/2001 |
| WO | WO 03/009366 A1 | 1/2003 |
| WO | WO 2004/079801 A1 | 9/2004 |
| WO | WO 2005/013318 A2 | 2/2005 |
| WO | WO 2005/043615 A1 | 5/2005 |

OTHER PUBLICATIONS

Auberton-Herve et al., "Smart-Cut: The Basic Fabrication Process for Unibond SOI Wafers," IEICE Transactions on Electronics, vol. E-80-C, No. 3, pp. 358-363 (1997).

Celler et al., "Frontiers of Silicon-on-Insulator," Journal of Applied Physics, 93(9): 4955-4978 (2003).

Colinge, "Silicon-On-Insulator Technology: Materials to VLSI, $2^{nd}$ Edition," Kluwer Academic Publishers, pp. 50-51 (1997).

Tong et al., "Semiconductor Wafer Bonding: Science and Technology," Wiley-Interscience Publication, pp. 1-15, 80-99(1999).

Search Report dated Sep. 7, 2006 from French application No. 05 13127.

* cited by examiner

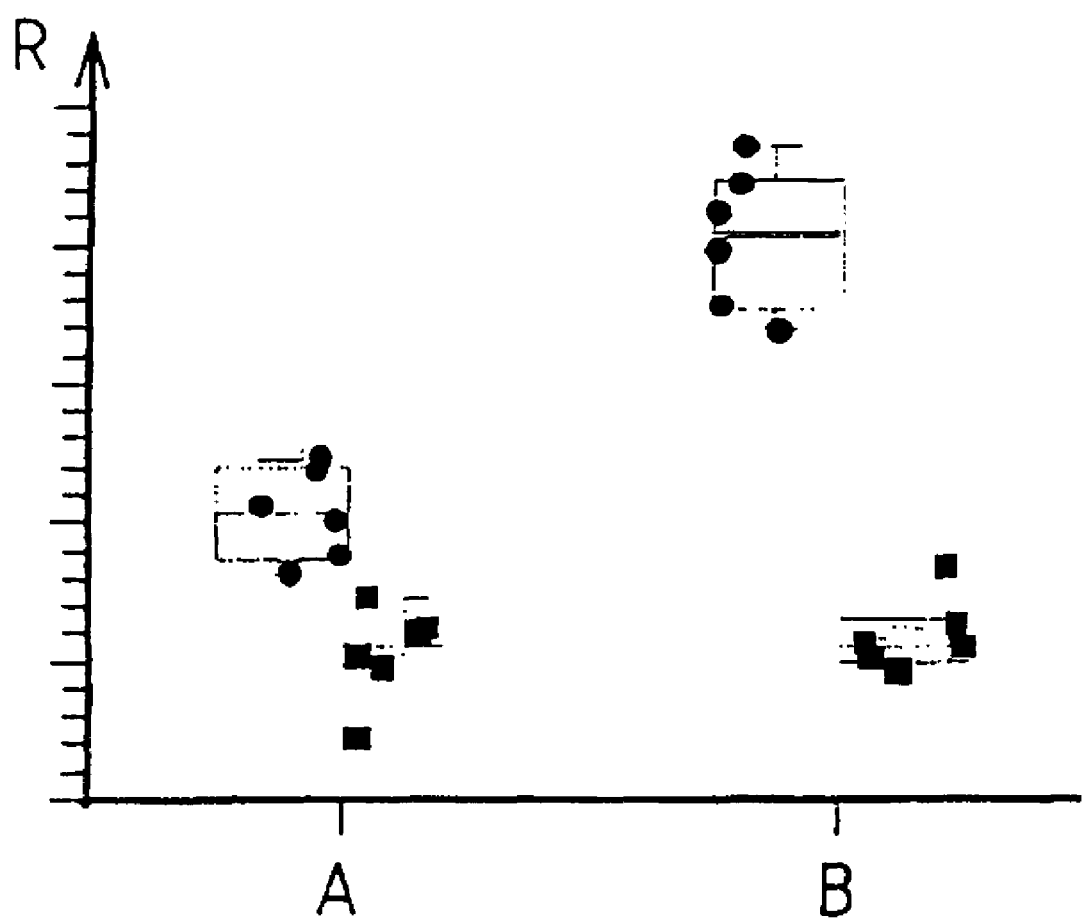
FIG_4

FINISHING PROCESS FOR THE MANUFACTURE OF A SEMICONDUCTOR STRUCTURE

BACKGROUND

The field of the invention is the formation of structures comprising a thin layer made of semiconductor material on a support substrate, by transferring the thin layer from a donor substrate to the support substrate. These structures are usually obtained by the use of a transfer process including steps to:

create a weakened zone within the thickness of a donor substrate;

bring the donor substrate into intimate contact with a support substrate;

detach the donor substrate at the weakened zone, to transfer part of the donor substrate onto the support substrate;

treat the part of the donor substrate transferred onto the support substrate to form the thin layer, with the treatment consisting of a sequence of finishing operations.

The invention more particularly relates to the formation of structures with a particularly thin layer, in other words the thickness of the thin layer is typically very thin, from about 100 to less than 1000 Angstroms, and in particular less than 500 Angstroms.

The well known SMART-CUT® processes are examples of transfer processes for making structures of this type and these correspond to a preferred embodiment of the invention. The structures formed by such processes are of the Semiconductor On Insulator (SeOI) type. Remember that in this case, an oxide layer is inserted between the support substrate and the thin layer. Structures obtained by such processes are used for applications in the microelectronics, optics and/or optronics fields.

After the donor substrate has been detached at the weakened zone, in order to transfer a part of the donor substrate onto the support substrate, it is known that that part must be treated to create the thin layer with the desired configuration and properties. Such a treatment is particularly designed to:

thin the part of the donor substrate transferred onto the support substrate, to bring it to the target thickness required for the thin layer;

reduce the surface roughness, particularly to satisfy surface condition specifications associated with structures used in the application fields mentioned above; and guarantee good quality in term of defects (surface defects, defects passing through the upper layer of the SeOI structure, etc.), and also to satisfy specifications for the application fields mentioned above.

This type of treatment of the structure obtained directly after detachment typically consists of a sequence of finishing operations. This sequence judiciously leads to one or several steps aimed at thinning the structure obtained after detachment, with one or several steps aimed at smoothing the free surface of the structure.

Thinning part of the donor substrate transferred onto the support substrate after detachment enables one to achieve the target thickness, and this typically is implemented by one or several sacrificial oxidation and/or polishing operations. A polishing operation is usually not desirable because such an operation reduces the uniformity of the thickness of the transferred layer. Thus, when a polishing operation is built into the finishing sequence, it is impossible to guarantee that the standard deviation of the thickness of the transferred layer will be less than 5 Å over the entire thin layer.

Application of a sacrificial oxidation operation is also limited. Such operations tend to cause some pre-existing defects to pass through and into the thin layer, leading to the formation of HF type defects, particularly when a large part of the thickness of the transferred layer is eliminated or removed. In order to limit the formation of such defects, an intermediate thermal annealing operation is usually made between two sacrificial oxidation steps, each of these two steps being designed only for a limited thinning of such layers. As an example of such a thermal annealing, a fast thermal annealing is typically done under a controlled atmosphere using a mode commonly called RTA (Rapid Thermal Annealing). This has been implemented to various degrees in the prior art.

PCT application WO 03/009366 discloses a finishing treatment step that is based on a "basic" sequence (that could be repeated) including a sequence consisting of a sacrificial oxidation operation followed by an RTA operation. It has been observed that a single RTA operation is inefficient, particularly in terms of reducing the surface roughness, when it is implemented on the surface obtained directly after detachment.

PCT application WO 2005/013318 suggests to combine a step to create a weakened zone formed by co-implantation with a finishing treatment step based on a "basic" sequence (that may possibly be repeated) including an RTA operation followed by a sacrificial oxidation operation.

Copending application Ser. No. 11/328,061 filed Jan. 10, 2006, the entire content of which is expressly incorporated herein by reference thereto, explains that it is preferable to transfer a thick layer and then thin this thick layer, rather than attempt to transfer a thin layer directly without thinning, if the resulting thin layer is to have a thickness that is less than 1000 Angstroms, and particularly less than 500 Angstroms.

It follows from the above that a finishing treatment for a thick layer requires several sacrificial oxidation operations (each designed for limited thinning only), with RTA smoothing operations being conducted between the sacrificial oxidation operations. It will easily be understood that the use of a large number of finishing operations has an adverse effect on the global cost of the process.

Furthermore, the formation of a structure with a specified final thickness leads to additional calibration of equipment that depends on the residual thickness of the layer to be treated. For example, calibration of the lamps of an RTA type furnace (necessary to guarantee uniform heating of a wafer) is calibrated as a function of the thickness of the upper layer of an SeOI structure. Thus, if a finishing treatment is necessary for a transferred layer with a thickness of the order of 2000 Angstroms immediately after detachment, it may be necessary to perform several RTA smoothing operations between several thinning operations, to obtain a final thin layer with a thickness of 500 Angstroms. It may then be necessary to adapt each RTA smoothing operation to each thickness (initial, intermediate, final) being treated. Such an adaptation can increase the complexity of a finishing treatment with multiple operations.

Therefore, an attempt is made to simplify the finishing operation as much as possible, without compromising the quality of the final structures. In the context of forming a thin layer structure, the finishing operation sequence selected as being preferred consists of repeating the sequence of a rapid thermal annealing operation followed by a sacrificial oxidation operation. This preferred sequence, also called RTA/Sacrox/RTA/Sacrox (where "Sacrox" denotes a sacrificial oxidation), has the advantage of being high performance in terms of quality, but has the disadvantage of including a large number of operations. Thus, there is a need in the art for simplified or improved processes to enhance the processing efficiency of such materials.

SUMMARY OF THE INVENTION

The present invention now simplifies the finishing operation, in particular by reducing the necessary number of operations without correspondingly risking compromising the quality of the final structure. Thus, the invention more precisely authorises the use of a finishing treatment that is significantly simpler than the preferred RTA/Sacrox/RTA/Sacrox sequence, particularly when forming a thin layer structure.

To achieve these advantages, the invention relates generally to a process for the formation of a structure comprising a thin layer of semiconductor material on a substrate, which comprises providing a zone of weakness in a donor substrate; bonding the donor substrate to a support substrate; detaching a portion of the donor substrate to transfer it to the support substrate, wherein the detaching comprises applying heat treating the donor substrate to weaken the zone of weakness without initiating detachment and applying an energy pulse to provoke self-maintained detachment of the donor substrate portion to transfer it to the support substrate; and subjecting the transferred portion of the donor substrate to a finishing operation to form a thin layer. Advantageously, the finishing operation is simplified compared to that which is conducted by a conventional process that achieves detaching by applying a heat treatment to provoke self-maintained detachment of the donor substrate portion, and the thin layer has a surface of the same smoothness as one prepared by the conventional process.

For example, the simplified finishing operation can consist essentially of subjecting the transferred portion to a first rapid thermal anneal followed by a sacrificial oxidation step and then followed by a second rapid thermal anneal to obtain essentially the same surface smoothness of the thin layer as one prepared by a conventional process that utilizes a first rapid thermal anneal followed by a first sacrificial oxidation step and then followed by a second rapid thermal anneal and a second sacrificial oxidation step. Also, the simplified finishing operation can consist essentially of subjecting the transferred portion to a single thermal anneal under an atmosphere of hydrogen, argon or hydrogen and argon at a temperature of between about 900° C. and 1200° C. for between five minutes and four hours followed by a single sacrificial oxidation step to obtain essentially the same surface smoothness of the thin layer as one prepared by a conventional process that utilizes a first rapid thermal anneal followed by a first sacrificial oxidation step and then followed by a second rapid thermal anneal and a second sacrificial oxidation step.

The resulting thin layer has a thickness of about 100 to less than 1000 Angstroms, and has a surface smoothness after the finishing operation of less than 5 Angstroms RMS over the entire surface as measured by scanning over a surface with an area equal to $10*10\ \mu m^2$. It also has a density of HF defects that is less than $0.3/cm^2$. Accordingly, the invention also relates to the semiconductor-on-insulator structure that includes such a thin layer.

BRIEF DESCRIPTION OF THE DRAWING FIGURES

Other aspects, purposes and advantages of this invention will become clear after reading the following detailed description of preferred embodiments of it, given as a non-limitative example with reference to the appended figures, wherein:

FIG. 4 is a diagram illustrating the gain in terms of roughness obtained by the use of one possible embodiment of the process according to the invention.

DETAILED DESCRIPTION OF THE PREFERRED EMBODIMENTS

Figure 1:
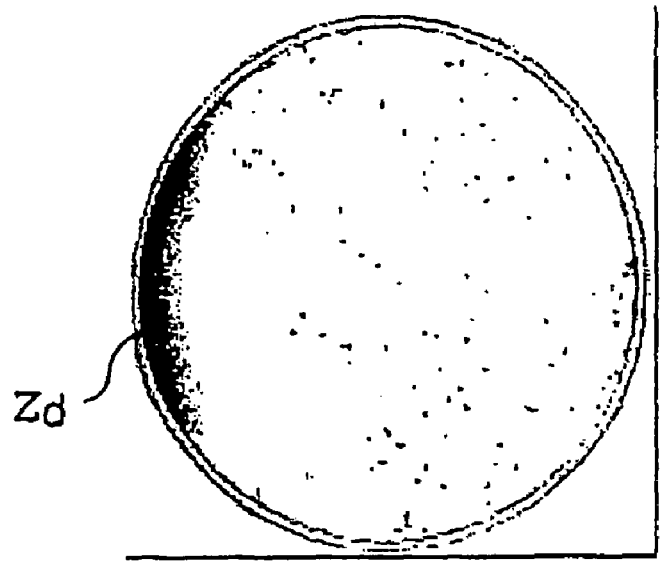
FIG. 1 is a map illustrating the presence of through defects in a thin layer of a structure obtained by use of a process according to the state of the art, particularly at the edge of the wafer.

The present process results in the formation of a structure comprising a thin layer made of a semiconductor or semiconducting material on a substrate. In a preferred treatment, this process includes steps to create a weakened zone within the thickness of a donor substrate, to bring the donor substrate into intimate contact with a support substrate, to detach the donor substrate at the weakened zone to transfer part of the donor substrate onto the support substrate, and to treat the part of the donor substrate transferred onto the support substrate to form the thin layer. This treatment is a finishing operation having a particular sequence of steps.

Detachment and transfer of the thin layer are achieved by the application of a heat treatment to develop weakening of the weakened zone without initiating thermal detachment of the part of the donor substrate; followed by application of an energy pulse to provoke self-maintained detachment of the part of the donor substrate. The finishing operation is a sequence that is simplified by eliminating the first or the last operation of a conventional sequence that includes repeating the sequencing of smoothing and thinning operations on the free surface of the transferred donor part.

Some preferred but non-limitative aspects of this process are as follows:

the simplified sequence is obtained by eliminating the first operation, and consists of a thinning operation inserted between two smoothing operations;

the simplified sequence is obtained by eliminating the last operation, and consists of a smoothing operation inserted between two thinning operations;

the smoothing operation is a thermal annealing, preferably rapid thermal annealing RTA;

the two smoothing operations previously conducted by separate rapid thermal annealing RTA steps can be merged into a single batch annealing operation with a smoothing effect equivalent to the two RTA operations, and this single step is performed before the thinning operation;

the thinning operation is a sacrificial oxidation operation;

the thermal budget of the treatment for development of weakening corresponds to 60% or more, and preferably 80% or more, but less than 100% of the thermal budget leading to a purely thermal detachment. This means that the zone of weakness is weakened significantly but that the donor substrate part is not detached by this operation alone. Generally, the heat treatment for development of weakening is an isothermal annealing conducted at a temperature of 350° C. for a duration of between two and three hours;

the weakened zone is created by implantation of species in the thickness of the donor substrate, with the implantation being applied by implantation of a single species or by co-implantation of at least two different species;

the thinning performed during the sequence of finishing operations is designed such that the thickness of the thin layer formed on the support substrate is between about 100 up to less than 1000 Angstroms, and particularly less than 500 Angstroms.

According to another aspect, the invention relates to an SeOI structure with a thin layer made of a semiconductor or semi-conducting material on a support substrate, with an insulating layer being present between the thin layer and the substrate. The thickness of the thin layer is as described above, and the density of HF defects in the thin layer is less than $0.3/cm^2$, and in particular is less than $0.2/cm^2$. In addition, the surface roughness of the thin layer as measured by scanning over a surface with an area equal to $10*10\ \mu m^2$ is less than 5 Å RMS, over the entire surface, with a standard deviation of the thickness of the thin layer being preferably less than 5 Å, over the entire surface.

As mentioned above, when forming a thin layer structure (having a thickness of about 100 to less than 1000 Angstroms), the sequence of finishing operations selected as being preferred for treatment of such a layer consists of repeating the sequence of a rapid thermal annealing (RTA) operation with a sacrificial oxidation operation. This preferred sequence is also denoted RTA/Sacrox/RTA/Sacrox.

As mentioned below, it appears impossible to simplify this finishing step without the risk of compromising the surface roughness or by causing defects to appear in the layer.

A first simplification that might be considered could consist of eliminating the last operation in the preferred RTA/Sacrox/RTA/Sacrox sequence to use a first simplified RTA/Sacrox/RTA sequence, but this first simplified sequence is not satisfactory, particularly for the formation of a structure with a thin layer. This simplified RTA/Sacrox/RTA sequence could generate "HF" type defects having depths that are greater than the thickness of the thin layer of the final structure (so-called through defects).

As shown in FIG. 1, these defects are located particularly in a dense zone Zd located at the edge of the wafer. These through defects reveal the presence of holes on the surface of the transferred layer, at the dense zone, directly after detachment. And the roughness of this dense zone after detachment is greater than the roughness of the remainder of the wafer. This phenomenon varies in intensity, depending on operating conditions of the steps of forming the weakened zone and of detachment. And obviously, the thinner the thin layer of the final structure, the more the phenomenon becomes problematic.

The dense zone Zd corresponds to the zone at the edge of the wafer at which detachment is initiated. Therefore, it is a rougher zone than the remainder of the wafer, and this cannot be completely cured by the first RTA smoothing operation. The extensive thinning, also done during a single sacrificial oxidation operation so that the end result obtained is a thin layer with a specified fine thickness, leads to the formation of HF type through defects. In general, such through defects cannot be cured by RTA type annealing. Specifically, the defects formed by the thinning operation cannot be cured by the final RTA smoothing operation.

A second simplification that might be contemplated could consist of eliminating the first operation in the preferred RTA/Sacrox/RTA/Sacrox sequence, to replace it with a second simplified Sacrox/RTA/Sacrox sequence. This second simplified sequence is not satisfactory either. Apart from possible problems of through defects, this second simplified sequence can also generate roughness problems, particularly at the edge of the wafer. As mentioned above, a dense rough zone is observed at the edge of the wafer immediately after detachment. The use of a single RTA smoothing operation cannot compensate for this edge roughness at the dense zone Zd. It will be observed that these roughness problems encountered with this second simplified sequence are closely related to problems caused by surface holes that arise with the first simplified sequence.

Figure 3A:
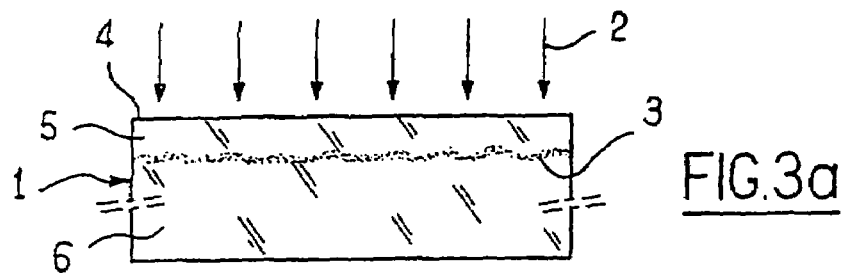
FIGS. 3a to 3d illustrate the different steps in the process according to the invention.
Figure 3B:
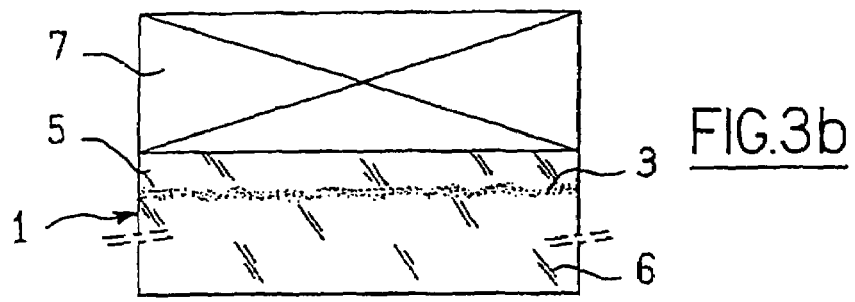
Figure 3C:
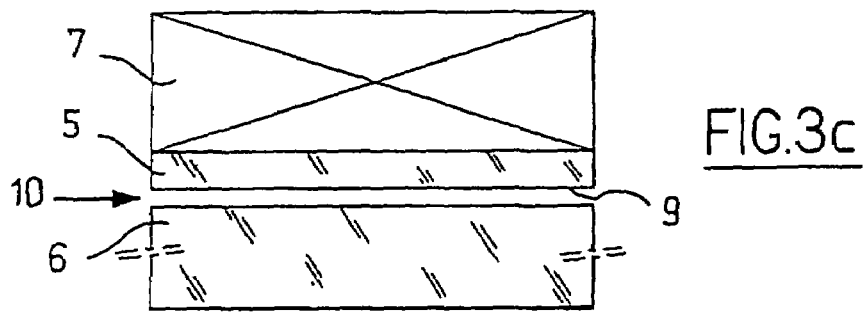

Returning to the detailed description of this invention, FIGS. 3a-3c show the different steps in one possible embodiment of the process according to the invention. FIG. 3a shows a donor substrate 1, for example a silicon substrate oxidised on its surface 4, subject to implantation shown diagrammatically by arrows, of species to create a weakened zone 3 within the thickness of the donor substrate 1. The implantation of atomic species may be a simple implantation, i.e., an implantation of a single atomic species such as hydrogen, helium or a rare gas. This implantation of atomic species may also be a co-implantation of atomic species (i.e. a successive or simultaneous implantation of at least two different atomic species), for example a co-implantation of hydrogen and helium.

The implantation conditions typically include the following:

For implantation of hydrogen alone, the dose is generally between 5 and $7 \times 10^{16}\ cm^{-2}$, and the energy is between 10 and 200 keV. Preferably, the dose is $5.7 \times 10^{16}\ cm^{-2}$ and the energy is 37 keV.

For the co-implantation of helium and hydrogen, the helium dose is between $0.5 \times 10^{16}\ cm^{-2}$ and $3 \times 10^{16}\ cm^{-2}$ and the energy is between 10 and 200 keV (preferably dose between $1 \times 10^{16}\ cm^{-2}$ and $2 \times 10^{16}\ cm^{-2}$ and energy about 50 keV); while for hydrogen the dose is between $0.5 \times 10^{16}\ cm-2$ and $3 \times 10^{16}\ cm^{-2}$ and the energy is between 10 and 200 keV (preferably dose between $1 \times 10^{16}\ cm^{-2}$ and $2 \times 10^{16}\ cm^{-2}$, and energy about 30 keV).

FIG. 3b shows the step during which the donor substrate 1 is brought into intimate contact with a support substrate 7 through its face 4. The donor substrate 1 is then detached at the weakened zone 3, to transfer part of the donor substrate 1 onto the support substrate 7. In the framework of the state-of-the-art processes, the detachment step generally consists of thermal annealing during which a spontaneous detachment occurs. In other words, it is a purely thermal detachment. Note that the art also teaches to conduct a purely mechanical detachment, particularly by making a blade move along the weakened zone 3.

In contrast to the art, this invention proposes to use another detachment mode, namely a detachment made by:

application of a heat treatment so as to enable development of the weakening of the weakened zone 3, without initiating thermal detachment, and application of an energy pulse so as to provoke self-maintained detachment of a part 5 of the donor substrate 1 delimited between the face 4 and the weakened layer 3, with regard to the remainder 6 of the donor substrate. Further details on this detachment mode can be obtained from PCT applications WO 2005/043615 and WO 2005/043616, the entire content of each of which is expressly incorporated herein by reference to the extent necessary to understand this mode.

Unlike a purely thermal detachment, the heat treatment applied in the present process to develop weakening is interrupted before detachment is initialized. In general, the weakening development heat treatment applied within the framework of the invention is designed to apply a thermal budget (duration and temperature pair) that is close to but less than the thermal budget necessary to result in a purely thermal detachment. Thus the thermal budget applied in the context of the invention corresponds to 60% or more, and preferably 80% or more, but less than 100% of the thermal budget leading to a purely thermal detachment. For example, the heat treatment to develop weakening is done in the form of an isothermal annealing at 350° C. for a duration of between two and three hours. It will be noted that the heat treatment to develop weakening applied during detachment will also enable consolidation of the bonding interface between the donor substrate and the support substrate in intimate contact.

FIG. 3c shows the actual detachment of a part of the donor substrate 5 with regard to the remainder 6 of donor substrate 1, using application of an input energy pulse, preferably with short duration and limited amplitude. The part 5 is thus transferred onto the support substrate 7. As an example, the energy pulse may be composed of a mechanical stress shown diagrammatically by arrow 10 in FIG. 3c. One non-limitative way of making this mechanical input is to use equipment similar to that conventionally used to separate the wafers after application of a purely thermal detachment (the term automatic separation machine is also used). The mechanical force applied by such separation equipment may be sufficient to cause self-maintained detachment.

The detachment obtained is self-maintained particularly in the sense that, unlike a purely mechanical detachment, there is no movement of a tool along the weakened zone. Since the detachment is self-maintained, there is no real propagation of a fracture wave in steps that could generate surface ripples. Furthermore, since there is no movement of any tool along newly created surfaces, there is no degradation to the surface condition of the surfaces thus exposed.

Thus, these surfaces have a relatively smooth surface condition, and the free face 9 of the thin layer 5 transferred onto the donor substrate in particular has much lower roughness than it has with classical solutions using spontaneous detachment during thermal annealing (purely thermal detachment), or a purely mechanical detachment.

In particular, it has been found that the surface roughness of the free face 9 and the density of holes on the surface of the free face 9 are significantly reduced at the edge of the wafer, at the dense zone Zd shown in FIG. 1. It has also been found that the use of this detachment mode provides a means of making a simplified finishing treatment, and particularly a finishing treatment according to either the first or second simplified sequences mentioned above, without compromising the surface roughness or generating any through type defects.

The invention thus proposes to combine the detachment mode mentioned above combining a "controlled" thermal weakening (particularly interrupted before detachment is initiated) and a local application of additional energy triggering "self-maintained" detachment along the weakened zone, with a treatment step for the structure obtained after detachment consisting of a sequence of simplified finishing operations.

Figure 3D:
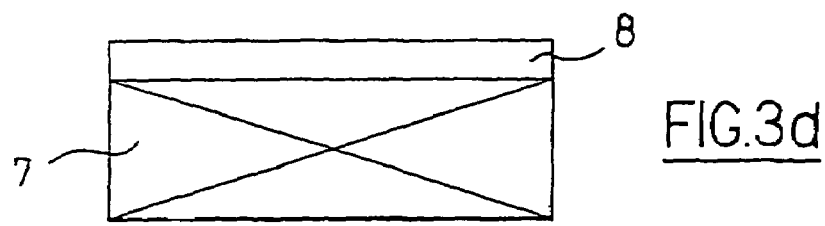

Therefore with reference to FIG. 3c, the structure obtained after detachment treated by the simplified sequence is the structure including the support substrate 7 and the part 5 of the donor substrate 1 transferred onto the donor substrate 7. In particular, the purpose of this sequence is to thin the part 5 to obtain the target thickness for the thin layer, to reduce the surface roughness and guarantee good quality in terms of defects. The end result after this treatment is the required final structure including the thin layer 8 (particularly with the target thickness) on the support substrate 7 (see FIG. 3d).

According to one particular embodiment, the simplified sequence is the first simplified sequence mentioned above, namely the RTA/Sacrox/RTA sequence. Note now that this first mode is advantageous in the framework of the formation of structures with a thin layer (thickness between about 100 but less than 1000 Angstroms) particularly in that it provides a means of preventing the appearance of through defects. In particular, the use of this first embodiment can lead to the formation of a 300 mm diameter SOI structure, for which the silicon thin layer is 350 Angstroms thick and for which the density of "HF" type defects is less than 0.3 defects/cm$^2$, or even less than 0.2 defects/cm$^2$.

Figure 2:
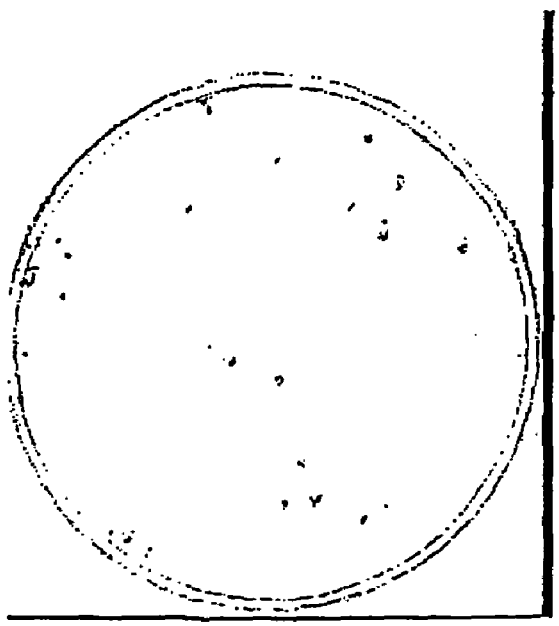
FIG. 2 is a map illustrating the small number of through defects in a thin layer obtained by the use of one possible embodiment of the process according to the invention.

The production of an RTA annealing immediately after "self-maintained" detachment provides a means of avoiding the appearance of holes that could open up after application of the sacrificial oxidation operation. The second RTA annealing can then complete the cure of residual defects, while slightly further reducing the surface roughness of the thin layer. And use of this first embodiment can typically achieve a roughness of less than 5 A RMS (as measured by a 10*10 $\mu m^2$ scan). FIG. 2 is a map similar to that in FIG. 1 illustrating the small number of through defects in a particularly thin layer (thickness 350 Angstroms) obtained by use of this first possible embodiment.

As a variant to this first embodiment, the invention also plans to use a single annealing operation, instead of two RTA annealing operations; this single annealing operation having an equivalent or even better smoothing effect than two RTA operations. In other words, two RTAs are combined in a single furnace annealing operation used before the thinning operation, this annealing operation in the furnace performing a smoothing effect equivalent to at least two RTAs. For example, such a single annealing operation may consist of annealing in a furnace (also called "Batch Anneal". The simplified sequence then consists of a thermal batch annealing operation followed by a sacrificial oxidation operation. For example, "Batch Annealing" may be done under a hydrogen and/or argon atmosphere at a temperature of between 900° C. and 1200° C. for a duration of between five minutes and four hours.

According to one second possible embodiment, the simplified sequence is the second simplified sequence mentioned above, namely the Sacrox/RTA/Sacrox sequence. Note that apart from the fact that this embodiment prevents the appearance of through defects, it also provides a means of achieving particularly low roughness at the edge of the wafer.

The use of the "self-maintained" detachment discussed above according to the invention, leads to a reduction in the density and depth of holes at the edge of the wafer. This reduction is accompanied by a reduction in the roughness at the edge of the wafer (the roughness at the centre only being slightly modified). Since there are no longer any problems of holes and roughness at the edge of the wafer, it becomes possible to use the Sacrox/RTA/Sacrox sequence.

FIG. 4 shows a measurement of the roughness R obtained by a scan across a 30*30 $\mu m^2$ area of the thin layer of the final structure, using an atomic force microscope AFM at the edge of the wafer (see round marks) and at the centre of the wafer (see square marks). The thin layer is more precisely a silicon layer with an SOI structure with a thickness of 1000 Angstroms.

This FIG. 4 compares the surface roughness of the thin layer during use of the simplified Sacrox/RTA/Sacrox finishing sequence following detachment conforming with that disclosed in the invention (case A, at the left in FIG. 4) and following a purely thermal detachment (case B, at the right in FIG. 4); It can be seen that use of the invention does not provide any particular gain in roughness at the center. On the other hand, it can be seen that use of the invention has a beneficial effect at the edge of the wafer. The roughness at the edge of the wafer is not too high, so that the simplified Sacrox/RTA/Sacrox sequence can be used as a finishing sequence. In any case, it will be noted that a homogeneous roughness is observed over the entire surface of the wafer after the simplified sequence has been used.

Within the framework of the invention, the rapid thermal annealing RTA operation is conventionally done for a duration of a few seconds or a few tens of seconds under a controlled atmosphere. In order to make an RTA annealing of the structure obtained after detachment, the structure is annealed at a high temperature, for example of the order of 900° C. to 1300° C. for 1 to 16 seconds. The controlled atmosphere may be an atmosphere comprising a mix of argon and hydrogen, or an atmosphere of pure argon, or an atmosphere of pure hydrogen.

Within the framework of the invention, the sacrificial oxidation operation is broken down in a manner conventionally known in itself into an oxidation step and a de-oxidation step, a heat treatment being inserted between the oxidation step and the de-oxidation step. The oxidation step is preferably carried out at a temperature of between 700° C. and 1100° C. It may be done by a dry method (for. example under gaseous oxygen) or a wet method (for example in an atmosphere containing water vapour). The oxidation atmosphere may also contain hydrochloric acid, both in dry method and in wet method.

The oxidation step leads to the formation of an oxide layer on the surface of the thin layer. The heat treatment may be carried out at constant or variable temperature. The heat treatment is preferably done at a temperature between 1100 and 1200° C. under an oxidizing atmosphere.

The de-oxidation step performed after the heat treatment removes the oxide layer formed during the oxidation step. For example, it is done by immersing the structure for a few minutes into a solution of 10% to 20% hydrofluoric acid.

In the above, sacrificial oxidation has been mentioned as being a preferred form of a thinning operation, but the invention is absolutely not limited to this preferred form, and includes other types of thinning operations, for example such as dry etching (for example plasma etching) or wet etching operations (chemical bath adapted to etching, for example of silicon; in particular an SCI, KOH, TMAH, etc. bath). It can be understood from the above that with the invention, a simplified sequence can be used as a finishing sequence in each of these different embodiments. Furthermore, note that no polishing operation is included in the finishing sequence in any of the different embodiments. It is thus possible to form thin layers, guaranteeing that the standard deviation of the thickness will be less than 5 A.

The invention also covers "thin layer on support substrate" structures, and particularly SeOI structures obtained by use of the process according to the first aspect of the invention as these have the improved properties disclosed herein compared to what can be obtained according to the prior art.

What is claimed is:

1. A process for the formation of a structure comprising a thin layer of semiconductor material on a substrate, which comprises:
    providing a zone of weakness in a donor substrate;
    bonding the donor substrate to a support substrate;
    detaching a portion of the donor substrate to transfer it to the support substrate, wherein the detaching comprises applying heat treating the donor substrate to weaken the zone of weakness without initiating detachment and applying an energy pulse to provoke self-maintained detachment of the donor substrate portion to transfer it to the support substrate; and
    subjecting the transferred portion of the donor substrate to a finishing operation to form a thin layer, wherein the finishing operation is simplified by having less steps compared to that which is conducted by a conventional process that achieves detaching by applying a heat treatment to provoke self-maintained detachment of the donor substrate portion and that forms the thin layer by a conventional finishing operation;
    wherein the simplified finishing operation is a sequence that is simplified by eliminating a first or last step of a conventional finishing operation that consists of repeating at least once a sequence of smoothing and thinning steps of either (a) a smoothing operation conducted on the free surface of the transferred portion of the donor substrate followed by a thinning operation conducted on the free surface of the transferred portion of the donor substrate, or (b) the thinning operation followed by the smoothing operation, and
    wherein the thin layer has a surface of the same smoothness as one prepared by the finishing operation of the conventional process.

2. The process of claim 1, wherein the simplified finishing operation consists of subjecting the transferred portion to a first rapid thermal anneal followed by a sacrificial oxidation step and then followed by a second rapid thermal anneal to obtain essentially the same surface smoothness of the thin layer as one prepared by a conventional process that utilizes a first rapid thermal anneal followed by a first sacrificial oxidation step and then followed by a second rapid thermal anneal and a second sacrificial oxidation step.

3. The process of claim 1, wherein the simplified finishing operation consists of subjecting the transferred portion to a single thermal anneal under an atmosphere of hydrogen, argon or hydrogen and argon at a temperature of between about 900° C. and 1200° C. for between five minutes and four hours followed by a single sacrificial oxidation step to obtain essentially the same surface smoothness of the thin layer as one prepared by a conventional process that utilizes a first rapid thermal anneal followed by a first sacrificial oxidation step and then followed by a second rapid thermal anneal and a second sacrificial oxidation step.

4. The process of claim 1, wherein the thin layer has a thickness of about 100 to less than 1000 Angstroms, and has a surface smoothness after the finishing operation of less than 5 Angstroms RMS over the entire surface as measured by scanning over a surface with an area equal to $10*10\ \mu m^2$.

5. The process of claim 1, wherein the simplified finishing operation consists of a thinning operation conducted between the two smoothing operations.

6. The process of claim 1, wherein simplified finishing operation consists of a smoothing operation conducted between the two thinning operations.

7. The process of claim 1, wherein the smoothing operation is a thermal annealing.

8. The process of claim 7, wherein the thermal annealing is a rapid thermal annealing.

9. The process of claim 1, wherein the thinning operation is a sacrificial oxidation operation.

10. The process of claim 1, wherein the heat treatment applied to the donor substrate to further weaken the zone of weakness represents a thermal budget that corresponds to at least about 60% to 80% but less than 100 % of the thermal budget that would lead to a purely thermal detachment.

11. The process of claim 10, wherein heat treatment applied to the donor substrate is an isothermal annealing conducted at 350° C. for a between two and three hours.

12. The process of claim 1, wherein the zone of weakness is provided by implantation of at least one atomic species into the donor substrate.

13. The process of claim 12, wherein the implantation includes co-implantation of at least two different atomic species.

14. The process of claim 1, wherein the finishing operation provides a density of HF defects in the thin layer that is less than 0.3/cm$^2$.

15. The process of claim 1, which further comprises providing an insulating layer between the thin layer and the support substrate to form a final semiconductor on insulator structure.

16. In a process for the formation of a structure comprising a thin layer of semiconductor material on a substrate, wherein the structure is obtained by providing a zone of weakness in a donor substrate; bonding the donor substrate to a support substrate; detaching a portion of the donor substrate to transfer it to the support substrate, and finishing of the donor substrate portion after detachment to form a thin layer having a desired surface roughness, the improvement which comprises:

simplifying the finishing of the transfer layer by conducting the detaching to apply heat treating of the donor substrate to weaken the zone of weakness without initiating detachment and then to apply an energy pulse to provoke self-maintained detachment and transfer of the donor substrate portion;

wherein the simplified finishing operation is a sequence that is simplified by eliminating a first or last step of a conventional multiple-step sequence that consists of repeating at least once a sequence of smoothing and thinning steps of either (a) a smoothing operation conducted on the free surface of the transferred portion of the donor substrate followed by a thinning operation conducted on the free surface of the transferred portion of the donor substrate, or (b) the thinning operation followed by the smoothing operation;

wherein the simplified finishing process results in the thin layer having a surface roughness of at least the same smoothness as one prepared by the conventional process.

* * * * *